United States Patent [19]

Bielke

[11] Patent Number: 4,692,767

[45] Date of Patent: Sep. 8, 1987

[54] METHOD OF MEASURING THE NUCLEAR MAGNETIC RESONANCE FOR USE IN NMR TOMOGRAPHY

[75] Inventor: Gernot Bielke, Oestrich-Winkel, Fed. Rep. of Germany

[73] Assignee: Bruker Medizintechnik GmbH, Fed. Rep. of Germany

[21] Appl. No.: 655,168

[22] Filed: Sep. 27, 1984

[30] Foreign Application Priority Data

Dec. 6, 1983 [DE] Fed. Rep. of Germany ....... 3343966

[51] Int. Cl.$^4$ ............................................. G01R 33/20
[52] U.S. Cl. .................................. 324/309; 324/312
[58] Field of Search ............... 324/300, 307, 309, 312; 364/719, 723, 413, 414

[56] References Cited

U.S. PATENT DOCUMENTS

| | | | |
|---|---|---|---|
| 4,471,305 | 9/1984 | Crooks et al. | 324/309 |
| 4,570,119 | 2/1986 | Wehrli et al. | 324/309 |
| 4,573,014 | 2/1986 | Riederer | 324/312 X |

FOREIGN PATENT DOCUMENTS 3209810 10/1983 Fed. Rep. of Germany .

OTHER PUBLICATIONS

"NMR: A Perspective on Imaging", by General Electric Company, 1982.
*Journal of the American Chemical Society*, pp. 7784, 7785, vol. 91, 1969, E. D. Becker et al.

*Primary Examiner*—Stewart J. Levy
*Assistant Examiner*—Scott M. Oldham
*Attorney, Agent, or Firm*—Harness, Dickey & Pierce

[57] ABSTRACT

In an NMR tomography method, the nuclear spins are caused by a pulse sequence to supply in one pass a number of successive induction signals, whereupon the induction signals corresponding to each other as regards their succession in time are processed by calculation to form a plurality of image signal sets corresponding to a sequence of section images which differ from each other by the intensity of the induction signals varying according to the relaxation time $T_1$ or $T_2$. Thereafter one establishes for each image point associated with a single volume element of the body cross-section a function describing the variation in time of the image signals associated with the respective image points in the different image signal sets, and generates a further image signal set by extrapolating the functions thus established to a point of time situated before the pre-determined measuring moment defined by the start of a pulse sequence following a first output pulse, and uses the image signal set thus obtained for producing a section image.

4 Claims, 3 Drawing Figures

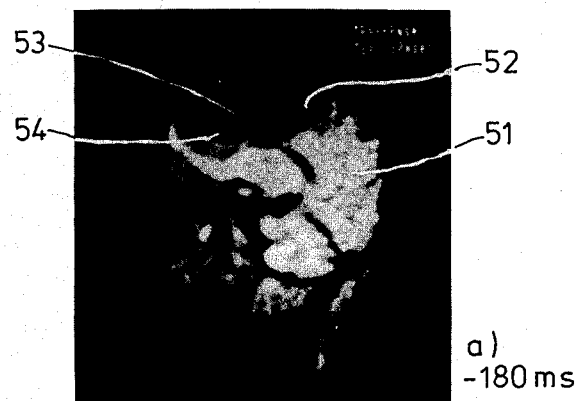
a) −180 ms
Fig. 2
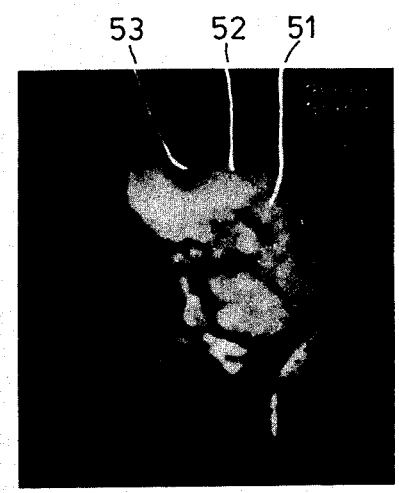
b) 49 ms
c) 133 ms
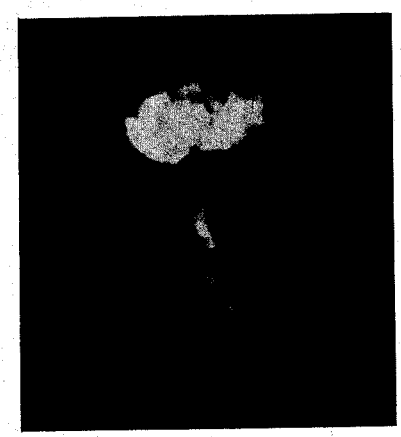
d) 217 ms
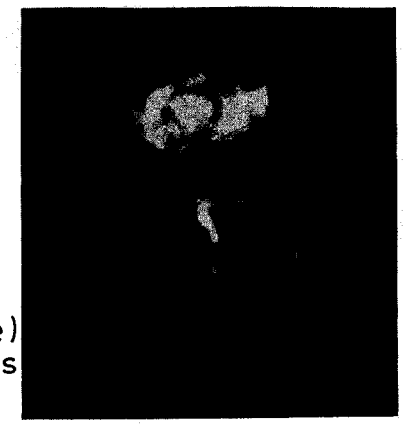
e) 301 ms

METHOD OF MEASURING THE NUCLEAR MAGNETIC RESONANCE FOR USE IN NMR TOMOGRAPHY

BACKGROUND OF THE INVENTION

The present invention relates to a method of measuring the nuclear magnetic resonance in selected areas of a body for two- or three-dimensional image recording (NMR tomography) comprising the steps of exposing initially the nuclear spins of a selected type present in the selected areas of the body to a static magnetic field and at least one superimposed gradient field, and exciting them selectively by means of a pulse sequence which causes the nuclear spins to supply in a single pass a plurality of successive induction signals, and processing thereafter by calculation the induction signals corresponding to each other as regards their succession in time, to form sets of image signals proportional to the induction signals in associated volume elements of the body so that a single measurement provides a plurality of image signal sets corresponding to a sequence of section images differing by the intensity of the induction signals which vary according to the relaxation time $T_1$ or $T_2$.

A method of this type has been known already from German Patent Publication No. 32 09 810. According to the known method, the individual image signal sets are used for generating separate cross-sectional images supplying different details because the intensities of the induction signals obtained from different areas of the body in which the relaxation time $T_1$ and/or $T_2$ are different, vary differently with time. In addition, it has been known from German Patent Publication No. 32 09 810 to calculate from the variation of the image signals associated with the individual image points the relaxation time $T_1$ and/or $T_2$, and on the one hand to represent only areas having a specific relaxation time and, on the other hand, to correct the intensity of all image points of the individual images using the exponential-functions corresponding to the relaxation times and, thus, to achieve an improvement of the signal-to-noise ratio and, thus, of the image quality without any prolongation of the measuring time.

Although the known method offers the possibility to obtain images of high quality and of different information content, it is still not satisfactory in practical use. The preparation of a greater number of images requires a lot of documentation work. In addition, the interpretation of a number of different images requires a particularly high standard of experience. To permit correct interpretation of the images, a profound knowledge of the physical processes encountered in the generation of the images is required. However, NMR tomography is on the way to becoming a means of diagnosis which the medical specialist should be able to use without particular knowledge of such physical processes. Accordingly, it is the object of the present invention to provide a method which permits the generation of a single image providing the fullest possible, yet clear and easily understandable information.

SUMMARY OF THE INVENTION

Starting out from the method described at the outset, this object is achieved by the steps of establishing for each image point associated with a single volume element of the body cross-section a function describing the variation in time of the image signals associated with the respective image points in the different image signal sets, generating thereafter a further image signal set by extrapolating the functions thus established to a predetermined point of time situated before the measuring moment defined by the start of a pulse sequence following a first output pulse, and using the image signal set thus obtained for producing a section image.

According to the method of the invention, instead of producing a plurality of different images, one calculates a single image valid for a point of time lying before the measuring moment, i.e. practically in a negative time domain, making use for this purpose of the established functions. Although such an image does not correspond to a real condition, it exhibits particularly great differences in the intensities of the image signals, due to the relaxation being extrapolated into the negative domain, and, thus, particularly high contrast, and this especially with respect to such tissue areas which while differing only little as regards the density of the excited nuclear spins, exhibit considerable differences as regards their relaxation times, as is normally the case with sound and bad areas of the same organ. Thus, the method of the invention permits to produce images permitting bad and sound tissue to be discerned with a clarity never reached heretobefore.

When applying the invention, it is sufficient to generate only a few cross-sectional images and, thus, less image signals per image point, because a few image points will suffice to indicate a functional relationship suitable for extrapolation purposes. One knows that relaxation processes follow generally an exponential-functions. Accordingly, extrapolation may be based also on an exponential-functions. The improvement in contrast achievable with the method of the invention may, however, be obtained also by superposition of several exponential-functions or other arbitrarily selected functions. It seems absolutely possible that specific diagnoses may require the use of different functions so as to obtain the desired improvement of contrast in specific areas which are of particular interest. In the simplest of all cases it may even be sufficient to record and generate the image signals of two cross-sectional images so that two image signals would be available for each image point which could be linked by arbitrary functions.

In the method of the invention, the same pulse sequences may be used as in normal NMR spectrography for establishing the relaxation times, i.e. in particular in the case of $T_1$ the DEFT sequence (see E. D. Becker et al in J. Amer. Chem. Soc., vol. 91 (1969), page 7784) with corresponding variants, or in the case of $T_2$ a Carr-Purcell sequence with or without Gill-Meiboom modification. In a preferred embodiment of the invention, the pulse sequence used is a spin-echo sequence, in particular a modified Carr-Purcell sequence which supplies image points varying in accordance with the spin-spin relaxation time $T_2$, and the measuring point defined by the 90° pulse is preceded by a recovery period which ensures that the intensity differences resulting form the different spin-lattice relaxation times $T_1$ are still distinct at the measuring moment. In this case, the intensities at the measuring moment reflect the longitudinal relaxation time $T_1$, while the shape of the curve is determined by the function describing the transverse relaxation. The articially generated image contains, therefore, information relating to both relaxation times which means that the information from different relaxation times $T_1$ and $T_2$ is simultaneously recorded in one image. In conventional methods, these two information elements would rather tend to cancel each other.

BRIEF DESCRIPTION OF THE DRAWINGS

The method of the invention will be described and explained hereafter in detail with reference to the drawing in which

FIGs. 2 shows a cross-sectional image (a) produced by the method of the invention, compared with cross-sectional images (b) to (e) obtained by conventional methods.

DETAILED DESCRIPTION OF THE PREFERRED EMBODIMENT

Figure 1:
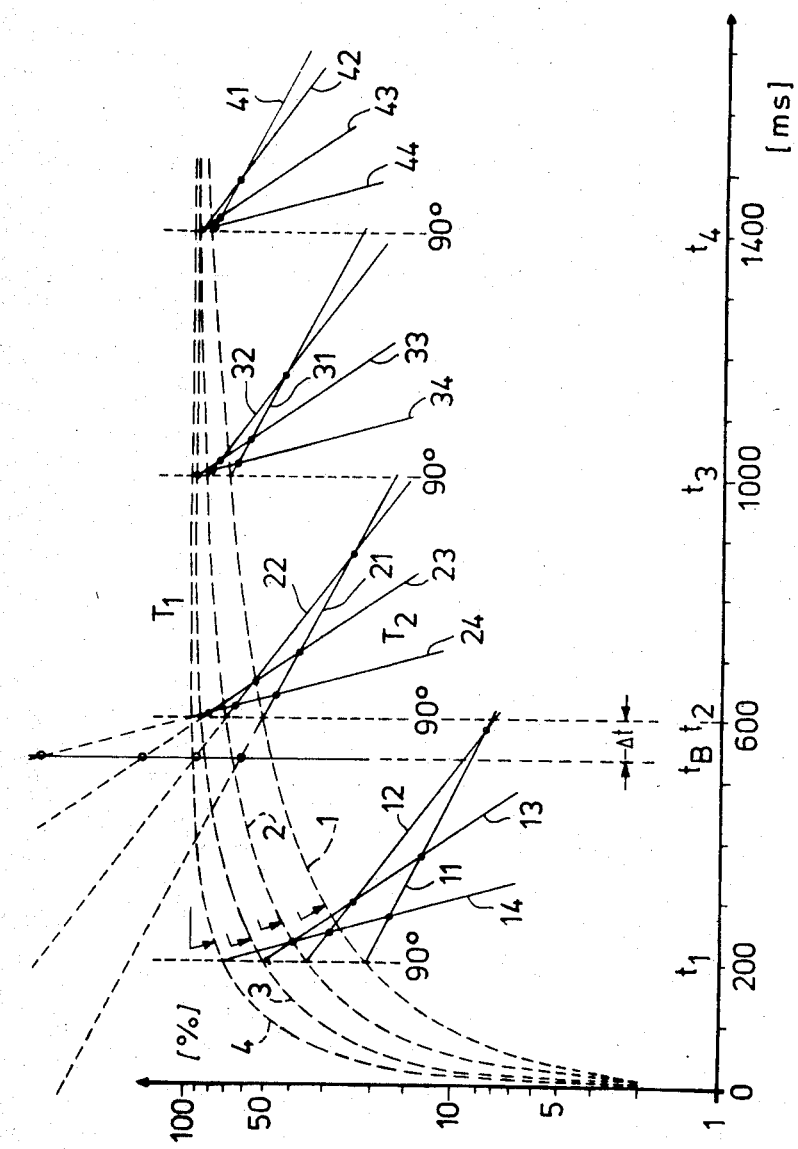
FIG. 1 shows a diagram illustrating one embodiment of the method of the invention.

As is generally known from NMR spectrometry, the longitudinal relaxation time $T_1$ describes the magnetization build-up in the longitudinal $B_0$ direction following a 90-degree excitation pulse by which the balanced condition of the longitudinal magnetization was disturbed. The longitudinal magnetization recovering in accordance with $T_1$ determines the intensity of the induction signal after application of a second 90° pulse as reference pulse. FIG. 1 shows in broken lines curves 1 to 4 which reflect the recovery of the longitudinal magnetization and, thus, the intensity of the reflected signal, as a function of time, following the application of a 90° interference pulse. As can be seen, the signals corresponding to curves 1 to 4 have substantially the same intensity after recovery of the magnetization, which is due to the fact that all these curves are based substantially on the same nuclear spin density which also determines the intensity of the induction signal. So, the great differences between the signal intensities in the heavily curved areas of curves 1 to 4 are indicative of the different longitudinal relaxation times $T_1$.

Instead of using a single reference pulse, one may also use a spin-echo sequence by which the transversal relaxation time $T_2$ can be determined. FIG. 1 shows the results obtained when applying a Carr-Purcell sequence at different measuring moments following the 90° interference pulse applied at the moment $P=0$. The Carr-Purcell sequence supplies at the measuring $t_1$ the relaxation curves 11, 12, 13 and 14 for $T_2$ formed by the envelope of the reflected signals. Similar curves are obtained for the relaxation time $T_2$ also when a Carr-Purcell sequence is applied at any one of the measuring moment $t_2$, $t_3$ or $t_4$, as is illustrated by the curves 21 to 24, 31 to 34 and 41 to 44 in FIG. 1. As can be seen in the drawing, intersections occur due to the different slopes of the curves. The signals represented by the different curves at the points of intersection have the same intensity which means that a loss in contrast is encountered. Thus, the additional information provided by $T_2$ tends to reduce, rather than to increase the contrast. The situation changes, however, when the curves for the relaxation time $T_2$ are extended to the left beyond the measuring moment, as shown in FIG. 1 for the relaxation curves 21 to 24 which have been extended beyond the measuring moment $t_2$ to a point at time $t_B$ which is spaced from $t_2$ by a negative amount $\Delta t$. It can be clearly seen that the differences in intensity are now very much greater so that the contrast of an image calculated for the imaginary point of time $t_B$ is much higher. It should be noted in addition that the signal intensity is represented in FIG. 1 in the logarithmic scale so that the exponential functions corresponding to the relaxation times $T_2$ give a straight line.

Figure 3:
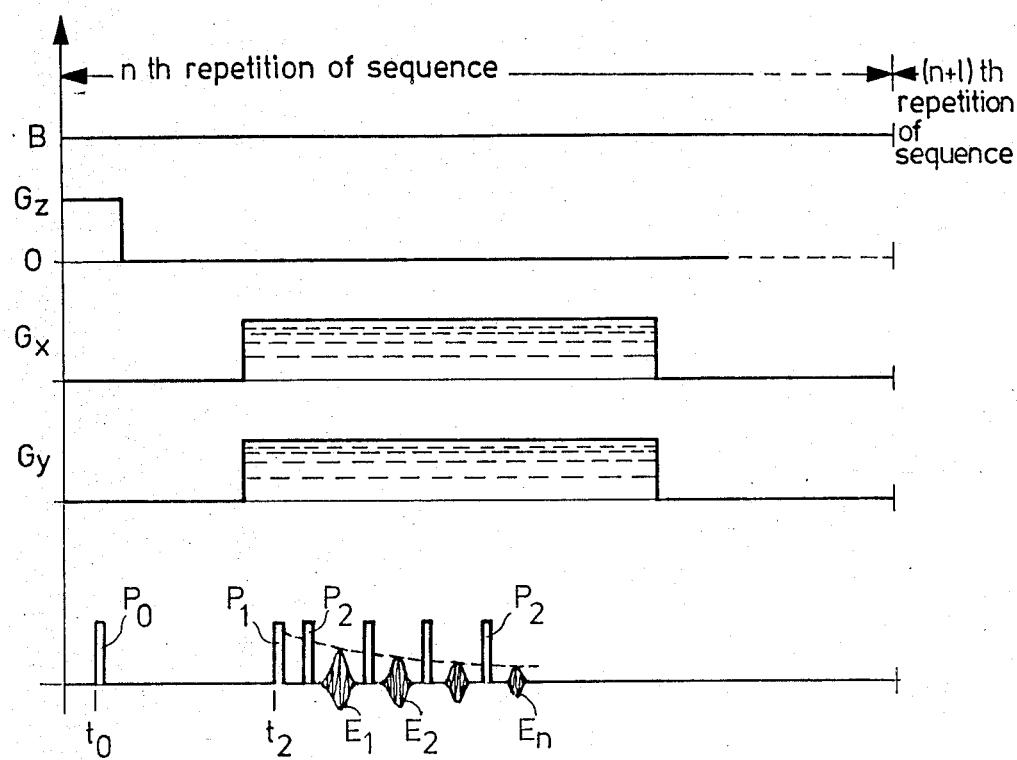
FIG. 3 is a pulse sequence timing diagram illustrating the relationship between the generation of the gradient fields ($G_z$, $G_y$, and $G_x$) and a sample pulse sequence started at time $t_2$, including echo pulses $P_2$, and echo signals $E_1$, $E_2$, ... $E_n$.

FIG. 3 illustrates an exemplary pulse sequence timing diagram according to the present invention. The broken lines in the boxes representing gradient fields $G_x$ and $G_y$ are intended to represent gradient fields of different strength which are applied during the different repetitions of the pulse sequence. However, in that the generation of suitable gradient fields is believed to be well within the skill of those versed in the art, further description is believed unnecessary.

The curves illustrated in FIG. 1 are a qualitative representation of the relaxation times of the induction signals supplied by the tissues of the human head, curves 1, 11, 21, 31 and 41 representing the induction signals supplied by the liquor, curves 2, 12, 22 and 42 the induction signals supplied by tumor tissue, curves 3, 13, 23, 33 and 43 the induction signals supplied by sound cerebral tissue, and curves 4, 14, 24, 34 and 44 the induction signals supplied by fatty tissue. FIG. 2 shows NMR images representing a sagittal section through a human head. FIG. 2(a) is an image obtained in accordance with the method of the invention, by exposing the nuclear spins to a Carr-Purcell pulse sequence 860 ms after application of a 90° interference pulse. The image signals obtained for the individual image poitns were extrapolated in the negative sense by 180 ms beyond the measuring moment, in accordance with an exponential-functions, so that the point of time to which the image relates is −180 ms. In image (a) one clearly discerns a big edema 52 in the bright cerebral tissue 51, and in the said edema a necrotic area 53 surrounded by a ring of bright tumor tissue 54. The high contrast between cerebral tissue, edema, tumor and necrosis permits a definite diagnosis at first glance.

The images (b) to (e) represent on the conrary section images of the conventional type obtained from the induction signals of the Carr-Purcell pulse sequence at different points of time following the measuring moment. Image (b) reflects the condition 49 ms, image (c) the condition 133 ms, image (d) the condition 217 ms, and image (e) the condition 301 ms after the measuring moment. Although images (b) to (e) differ substantially according to the transversal relaxation, none of them provides the complete information provided by image (a), i.e. the one obtained in accordance with the method of the invention. In image (b), the edema 52 can hardly be discerned in the sound cerebral tissue 51, and the darker spot representing the necrotic area 53 is also difficult to interpret because no trace can be seen of the ring formed by the tumor around the necrosis. With rising relaxation time, the edema 52 can be seen more clearly, but on the other hand the dark spot 53 visible in image (c) and representing the necrotic area has vanished in image (b) which makes an interpretation even more difficult. In the following images, the sound tissue gets more and more invisible so that an interpretation becomes increasingly difficult, while the ring structure with the central necrotic area, which is indicative of a tumor, is still not clearly discernible.

From the above example it appears that the method of the invention gives a single image the information content of which is substantially superior to the information content of the image sets produced heretofore, so that the method of the invention combines in itself the advantages of permitting quicker, yet more precise diagnoses, and reducing at the same time the amount of documentation work required.

The present invention is not limited to the described application, but that by using different pulse sequences and selecting appropriate measuring times and negative extrapolation times the method of the invention can be varied within very broad limits and adapted optimally to even very specific examinations.

What is claimed is:

1. A method for measuring the nuclear magnetic resonance in selected areas of a body for two-or three-dimensional image recording (NMR tomography) comprising the steps of:

exposing initially the nuclear spins of a selected type present in the selected areas of the body to a static magnetic field and at least one superimposed gradient field, and exciting them selectively by means of a pulse sequence which causes the nuclear spins to supply in a single pass a plurality of successive induction signals, and processing thereafter by calculation the induction signals corresponding to each other as regards their succession in time, to form sets of image signals proportional to the induction signals in associated volume elements of the body so that a single measurement provides a plurality of image signal sets corresponding to a sequence of section images differing by the intensity of the induction signals which vary according to the relaxation time $T_2$, establishing for each image point associated with a single volume element of the body cross-section a function describing the variation in time of the image signals associated with the respective image points in the different image signal sets, generating thereafter a further image signal set by extrapolating the functions thus established to a pre-determined point of time situated before the measuring moment defined by the start of said pulse sequence, and using the image signal set thus obtained for producing a section image.

2. A method according to claim 1, characterized in that the function used is an exponential-functions approximated to the variation in time of the image points.

3. A method for measuring the nuclear magnetic resonance in selected areas of a body for two or three-dimensional image recording (NMR tomography) comprising the steps of:

exposing initially the nuclear spins of a selected type present in the selected areas of the body to a static magnetic field and at least one superimposed gradient field, and exciting them selectively by means of an excitation pulse and a following spin-echo sequence having a first 90°-pulse, said spin-echo sequence causing the nuclear spins to supply in a single pass a plurality of successive induction signals, and processing thereafter by calculation the induction signals corresponding to each other as regards their succession in time, to form sets of image signals proportional to the induction signals in associated volume elements of the body so that a single measurement provides a plurality of image signal sets corresponding to a sequence of section images differing by the intensity of the induction signals which vary according to the relaxation times $T_1$ and $T_2$, establishing for each image point associated with a single volume element of the body cross-section a function describing the variation in time of the image signals associated with the respective image points in the different image signal sets, generating thereafter a further image signal set by extrapolating the functions thus established to a predetermined point of time situated before said first pulse of the spin-echo sequence, the spacing between said first pulse and said excitation pulse being so selected that the differences in intensity resulting from different spin-lattice relaxation times $T_1$ are still distinct at the moment, when said first pulse occurs.

4. A method according to claim 3 characterized in that the function used is an exponential-function approximated to the variation in time of the image points.

* * * * *

UNITED STATES PATENT AND TRADEMARK OFFICE
CERTIFICATE OF CORRECTION

PATENT NO. : 4,692,767
DATED : September 8, 1987
INVENTOR(S) : Gernot Bielke

It is certified that error appears in the above-identified patent and that said Letters Patent is hereby corrected as shown below:

Column 2, line 25, "heretobefore" should be --heretofore--.

Column 2, line 60, "form" should be --from--.

Column 3, line 11, "Figures" should be --Figure--.

Column 3, line 67, "at" should be --of--.

Column 4, line 31, "poitns" should be --points--.

Column 4, line 41, "conrary" should be --contrary--.

Column 6, line 2, claim 2, "exponential-functions" should be --exponential-function--.

Signed and Sealed this

Twenty-ninth Day of March, 1988

Attest:

DONALD J. QUIGG

Attesting Officer

Commissioner of Patents and Trademarks